(12) United States Patent
Ishida et al.

(10) Patent No.: US 7,168,837 B2
(45) Date of Patent: Jan. 30, 2007

(54) VEHICULAR HEADLAMP AND SEMICONDUCTOR LIGHT EMITTING ELEMENT

(75) Inventors: Hiroyuki Ishida, Shizuoka-ken (JP); Kiyoshi Sazuka, Shizuoka-ken (JP); Masashi Tatsukawa, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/814,269

(22) Filed: Apr. 1, 2004

(65) Prior Publication Data

US 2004/0196663 A1   Oct. 7, 2004

(30) Foreign Application Priority Data

Apr. 3, 2003   (JP) ............... 2003-100478

(51) Int. Cl.
F21V 1/00   (2006.01)

(52) U.S. Cl. ............... 362/539; 362/507; 362/545; 362/555

(58) Field of Classification Search ............... 362/539, 362/507, 545, 555, 800, 538, 540–542; 257/88, 257/98, 99, 79
See application file for complete search history.

(56) References Cited

U.S. PATENT DOCUMENTS 5,753,940 A * 5/1998 Komoto ............... 257/95
6,565,247 B2 * 5/2003 Thominet ............... 362/545
6,617,615 B1 * 9/2003 Ueda ............... 257/98

FOREIGN PATENT DOCUMENTS

| JP | 08-125278   | 5/1996 |
| JP | 10-125106   | 5/1998 |
| JP | 2003-31011 A | 1/2003 |

* cited by examiner

*Primary Examiner*—Sandra O'Shea
*Assistant Examiner*—Mark Tsidulko
(74) *Attorney, Agent, or Firm*—Sughrue Mion, PLLC

(57) ABSTRACT

A vehicular headlamp for emitting light with a predetermined light distribution pattern, includes a semiconductor light emitting element including a substantially linear light emitting area for generating the light therefrom, and an optical device for forming at least a part of a cut line to determine a boundary between bright and dark with regard to the light distribution pattern by reflecting or deflecting the light generated by the semiconductor light emitting element and projecting a shape of the light emitting area. The vehicular headlamp may further include a plurality of the semiconductor light emitting elements being arranged in a row in a direction corresponding to at least a part of the cut line, wherein the optical device forms at least a part of the cut line by projecting the shape of the light emitting area with regard to each of the plurality of semiconductor light emitting elements towards positions arranged in a row over at least a part of the cut line.

19 Claims, 12 Drawing Sheets

VEHICULAR HEADLAMP AND SEMICONDUCTOR LIGHT EMITTING ELEMENT

BACKGROUND OF THE INVENTION

The present application claims priority from a Japanese Patent Application No. 2003-100478 filed on Apr. 3, 2003, the contents of which are incorporated herein by reference.

1. Field of the Invention

The present invention relates to a vehicular headlamp and a semiconductor light emitting element. More particularly, the present invention relates to a vehicular headlamp for emitting light with a predetermined light distribution pattern.

2. Description of the Related Art

With regard to a vehicular headlamp, in view of security, it is necessary to form a light distribution pattern with high precision. This light distribution pattern is formed by an optical system using, e.g. a reflector or lens as disclosed, for example, in Japanese Patent Application Laid-Open No. 1994-089601. Recently, it has been studied that a semiconductor light emitting element is used for the vehicular headlamp.

A semiconductor light emitting element generates light from its light emitting area having predetermined spread with regard to its surface or cross-section. In this case, since optical system design becomes complicated, it might be difficult to form a proper light distribution pattern.

SUMMARY OF THE INVENTION

Therefore, it is an object of the present invention to provide a vehicular headlamp and a semiconductor light emitting element, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp for emitting light with a predetermined light distribution pattern, includes a semiconductor light emitting element including a substantially linear light emitting area for generating the light therefrom, and an optical device for forming at least a part of a cut line to determine a boundary between bright and dark with regard to the light distribution pattern by reflecting or deflecting the light generated by the semiconductor light emitting element and projecting a shape of the light emitting area.

The vehicular headlamp may further include a plurality of the semiconductor light emitting elements being arranged in a row in a direction corresponding to at least a part of the cut line, wherein the optical device forms at least a part of the cut line by projecting the shape of the light emitting area with regard to each of the plurality of semiconductor light emitting elements towards positions arranged in a row over at least a part of the cut line.

The semiconductor light emitting element may further include an active layer, and the light emitting area has a groove for emitting the light from at lease a part of an opening of the groove, the groove substantially linearly extending on a surface of the semiconductor light emitting element, the depth of the groove reaching at least a part of the active layer.

According to the second aspect of the present invention, a semiconductor light emitting element used for a vehicular headlamp for emitting light with a predetermined light distribution pattern, includes an active layer, and a light emitting area having a groove for emitting the light from at lease a part of an opening of the groove, the groove extending on a surface of the semiconductor light emitting element in a direction corresponding to at least a part of a cut line to determine a boundary between bright and dark with regard to the light distribution pattern, the depth of the groove reaching at least a part of the active layer.

The headlamp to which the present invention may be applied includes, but not limited to, a regular headlamp, fog lamp and cornering lamp of automobiles, motorcycles and trains.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
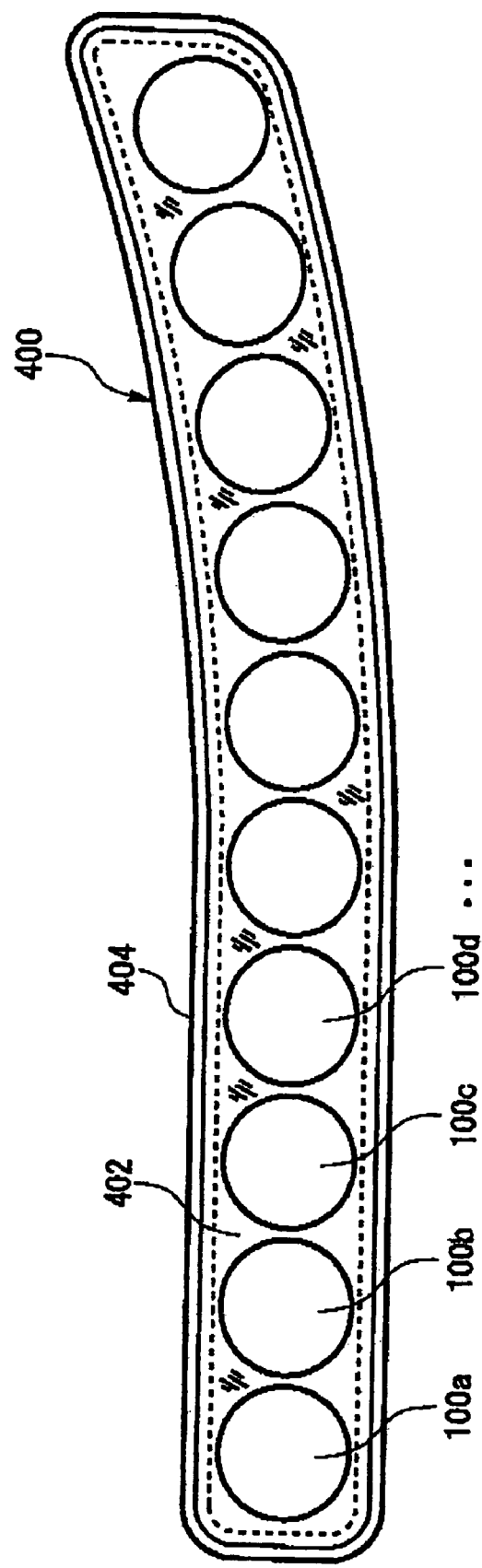
FIG. 1 shows an example of the configuration of a vehicular lamp related to an exemplary embodiment of the present invention.

FIG. 1 shows an example of the configuration of a vehicular lamp 400 related to an exemplary embodiment of the present invention. The vehicular lamp 400 is for, e.g., low beam emission to emit light forward from a vehicle in a predetermined emission direction. It is an object of the vehicular lamp 400 according to this embodiment to properly form a light distribution pattern for a vehicular headlamp. The vehicular lamp 400 contains a plurality of light source units 100 in an approximately horizontal row inside a lamp chamber consisting of a transparent cover 402 having a translucent shape and a lamp body 404.

These light source units 100 have the same or similar configuration as each other, and their optical axes are facing downwards by 0.3 to 0.6 degrees inside the lamp chamber when the vehicular lamp 400 is attached to the vehicle body. The vehicular lamp 400 emits light forward from the vehicle, and forms a predetermined light distribution pattern, based on the light emitted those light source units 100. The vehicular lamp 400 may include a plurality light source units 100 whose light distribution characteristics are different from each other. In this embodiment, the vehicular lamp 400 includes a plurality of light source units 100a to 100d whose light distribution characteristics are different from each other.

Figure 2:
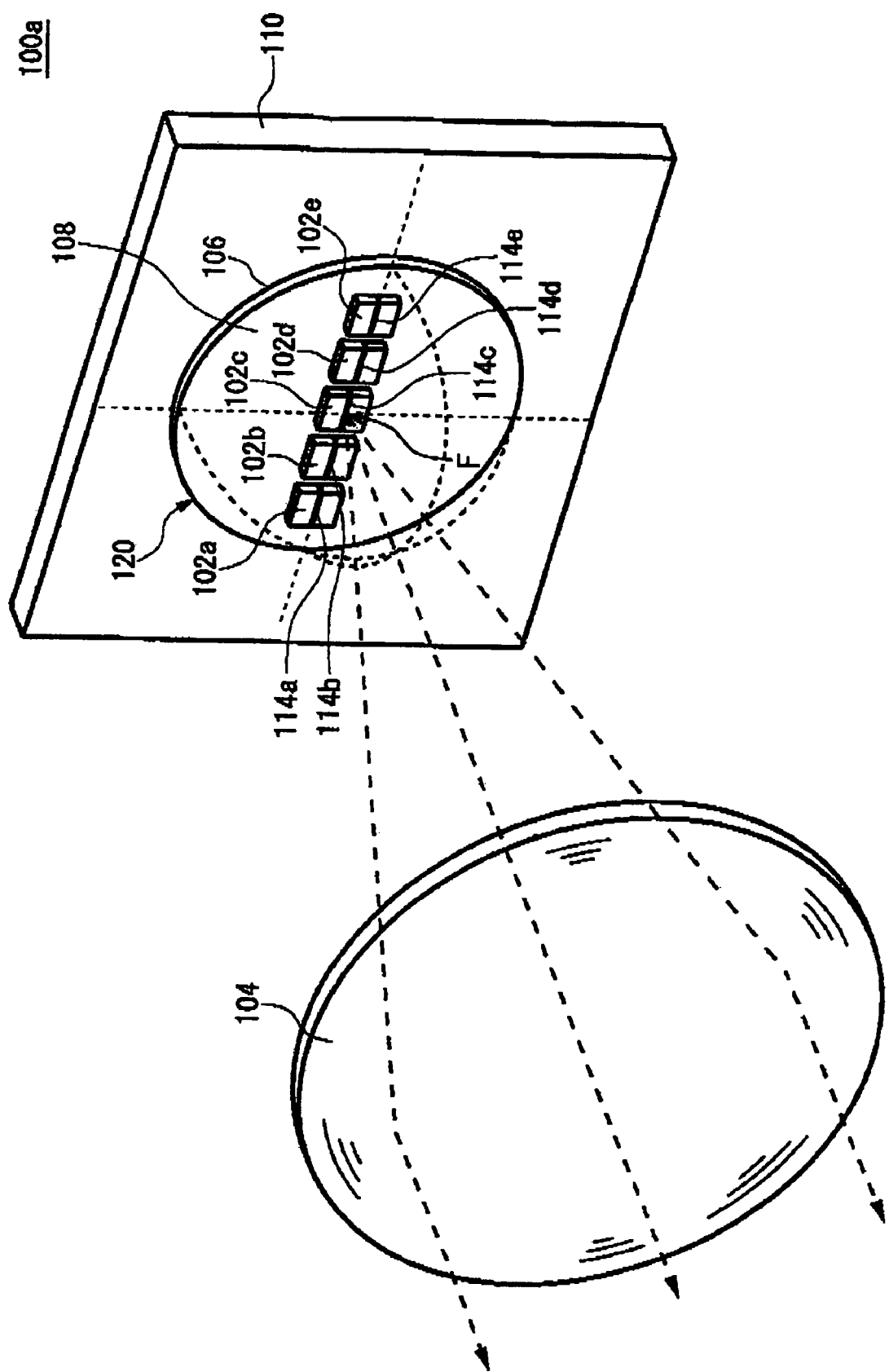
FIG. 2 shows an example of the configuration of a light source unit.

FIG. 2 shows an example of the configuration of a light source unit 100a. The light source unit 100a which is a direct emission type light source for emitting the light generated from a light source 120 forward through a lens 104 includes a supporting member 110, a light source 120, and a lens 104. The supporting member 110 is a plate-shaped body for supporting and fixing the bottom of the light source 120 on its surface facing forward from the vehicle, whereby the light source 120 emits light forward from the vehicle. In addition, the supporting member 110 is formed of a material whose thermal conductivity is higher than that of air such as a metal, so that it functions as a heat radiating plate for radiating the heat generated from the light source 120 by allowing its surface to contact the bottom of the light source 120. Accordingly, that prevents the luminosity of the light source from decreasing.

The light source 120 which is a light emitting diode module includes a substrate 106, a plurality of semiconductor light emitting elements 102a to 102e, and a sealing member 108. The substrate 106 which a disc-shaped body fixed to the surface of the supporting member 110 supports the plurality of semiconductor light emitting elements 102a to 102e to face the lens 104. In addition, at least a part of the substrate 106 is formed of a material, whose thermal conductivity is higher than air such as a metal so as to conduct the heat generated from the semiconductor light emitting elements 102a to 102e towards the supporting member 110.

The plurality of semiconductor light emitting elements 102a to 102e, which are light emitting diodes for emitting light from approximately linear light emitting areas 114a to 114e respectively, are arranged in a row at approximately equal intervals in the lateral direction to the vehicle facing the supporting member 110 with the substrate 106 interposed therebetween. In this embodiment, the plurality of semiconductor light emitting elements 102a to 102e are arranged so that their light emitting areas 114a to 114e are arranged in an approximately straight line. In this case, the light source 120 generates light from the area in the shape of an approximately straight line connecting the light emitting areas 114a to 114e.

Here, each of the surfaces of the semiconductor light emitting elements 102 is approximately rectangular by about 1 mm square. The light emitting area 114 is about 0.1 to 0.2 mm in width of the shorter side and about 0.7 to 0.9 mm in length of the longer side. The width of the light emitting area 114 may be about 1 to 10 μm. The length of the light emitting area 114 may be approximately the same as the width of the semiconductor light emitting element 102 along the longer side of the light emitting area 114. The width of the light emitting area 114 may be smaller than that of the semiconductor light emitting element 102. The width of the light emitting area 114 may be about $1/100$ to $1/1000$ of the length. The width of the light emitting area 114 may be 0.1 mm or less, e.g. a few tens μm.

In addition, the semiconductor light emitting element 102a to 102e are preferably arranged at narrow intervals such that adjacent two of the semiconductor light emitting elements 102 approximately contact each other. In this case, a straight line-shaped image without a gap can be formed based on the light generated by the light source 120.

Further, in this embodiment, each of the semiconductor light emitting elements 102a to 102e allows a fluorescent material provided thereon to emit yellow light which is complementary to blue light by emitting blue light towards the fluorescent material. Accordingly, the light source 120 generates white light based on the blue and yellow light generated by the semiconductor light emitting elements 102a to 102e and the fluorescent materials respectively. In another embodiment, the semiconductor light emitting elements 102a to 102e may generate white light from the fluorescent materials by emitting ultraviolet light towards the fluorescent materials.

The sealing member 108 which is a mold formed of, e.g. transparent resin to face the substrate 106 with the semiconductor light emitting elements 102a to 102e interposed therebetween seals the plurality of semiconductor light emitting elements 102a to 102e. In this embodiment, the sealing member 108 has the shape of a hemisphere whose center is positioned near the middle of the light emitting area 114c. In this case, that reduces the reflection from the surface of the sealing member 108. Accordingly, the light source 120 can emit the light generated by the semiconductor light emitting elements 102a to 102e outwards highly efficiently.

The lens 104 which an optical device to deflect the light generated by the plurality of semiconductor light emitting elements 102a to 102e is provided in front of the vehicle facing the semiconductor light emitting elements 102a to 102e, and emits the generated light forward from the vehicle by passing the light through. The lens 104 forms at least a part of a cut line for determining a boundary between bright and dark with regard to the light distribution by projecting the shapes of the light emitting areas 114a to 114e forward from the vehicle. The lens 104 may project images of the light emitting areas 114a to 114e to form at least a part of the cut line based on the boundary between bright and dark of the images.

Here, in this embodiment, the lens 104 has its optical center F on the light emitting area 114c, where the optical center F is a focus or a reference point in design. In this case, the shapes of the light emitting areas 114a to 114e within the focus surface can be projected highly precisely. According to this embodiment, the cut line can be formed accurately and properly. According to this embodiment, the size of the light source unit 100 can also be reduced by using the semiconductor light emitting elements 102 as the light source.

Further, the lens 104 has its optical center F in the middle of a predetermined range on the light emitting area 114c corresponding to the precision required to form the cut line. Also, the lens 104 may have its optical center F approximately on any of the light emitting areas 114a, 114b, 114d and 114e.

In another embodiment, the light source unit 100a may have one semiconductor light emitting element 102. In this case, the lens 104 has its optical center F on the light emitting area 114 of that semiconductor light emitting element 102, and projects the image of that light emitting area 114 to form at least a part of the cut line. The lens 104 forms the cut line based on the boundary between bright and dark of that image. In this case, the cut line can also be formed properly based on the approximately linear shape of the light emitting area 114.

In this case, since the light source unit 100*a* projects the image of the light emitting area 11 with regard to one semiconductor light emitting element 102, a linear image without any gap can also be formed properly based on the shape of the light emitting area 114. Further, since one lens 104 is provided in response to one semiconductor light emitting element 102, the image of the light emitting area 114 can be projected clearly. In addition, the cut line can be formed clearly.

In further another embodiment, the light source unit 100*a* may further have a light shielding member (shade) for shielding a part of the light generated by the light source 120. The light shielding member may be provided between the projecting lens 104 and the light source 120. The projecting lens 104 may form a part of the cut line based on the boundary between bright and dark formed near a peripheral section of the light shielding member.

Figure 3:
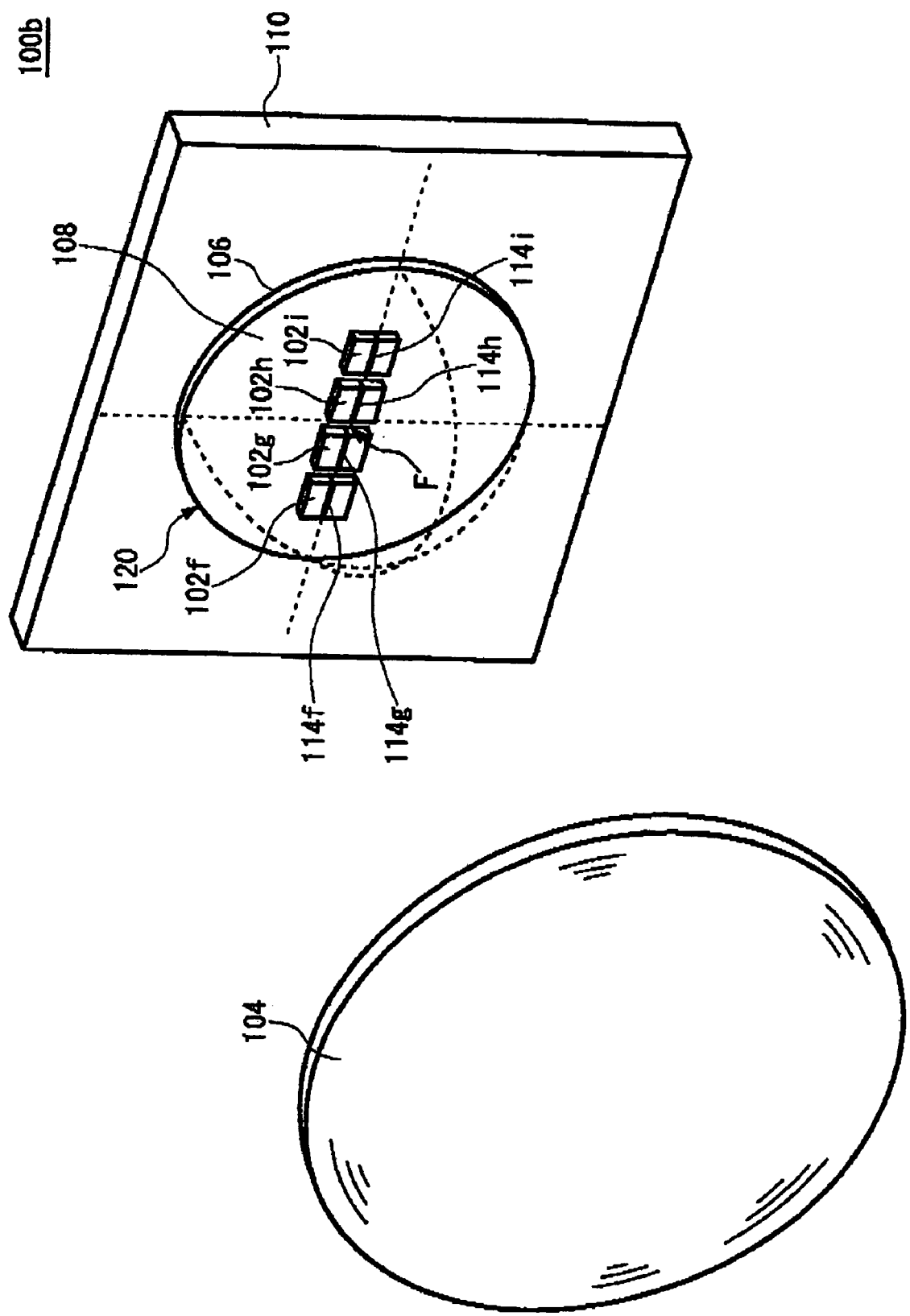
FIG. 3 shows an example of the configuration of a light source unit 100b.

FIG. 3 shows an example of the configuration of a light source unit 100*b*. The light source unit 100*b* includes a supporting member 110, a light source 120, and a lens 104. The light source 120 includes a substrate 106, a plurality of semiconductor light emitting elements 102*f* to 102*i*, and a sealing member 108.

The light source 120 has the same configuration and function as those of the light source 120 of the light source unit 100*a* except including the semiconductor light emitting elements 102*f* to 102*i* in place of the semiconductor light emitting elements 102*a* to 102*e* (cf. FIG. 2).

The semiconductor light emitting elements 102*f* to 102*i* are arranged at intervals approximately equal to those of the semiconductor light emitting element 102*a* to 102*e* so that their light emitting areas 114*f* to 114*i* are arranged in an approximately straight line. In addition, each of the semiconductor light emitting elements 102*f* to 102*i* is arranged in order that its center is positioned in response to each gap between any adjacent two of the semiconductor light emitting elements 102 provided in the light source unit 100*a*. For example, the semiconductor light emitting element 102*f* is arranged in order that its center is positioned to the gap between the semiconductor light emitting elements 102*a* and 102*b* (cf. FIG. 2). Accordingly, the semiconductor light emitting elements 102*f* to 102*i* generate the light compensating for the gaps in the light generated by the semiconductor light emitting elements 102*a* to 102*e*. The semiconductor light emitting element 102*f* to 102*i* may be positioned being laterally shifted as much as half the width of one of the semiconductor light emitting elements 102 with respect to the semiconductor light emitting elements 102*a* to 102*d* of the light source unit 100*a*.

In this case, the light source units 100*a* and 100*b* project both the images of the light emitting areas 114*a* to 114*i* in a complementary manner. The vehicular lamp 400 forms at least a part of the cut line based on the boundary between bright and dark of those images. According to this embodiment, the cut line can be formed properly. Further, matters in FIG. 3 given the same symbols as those in FIG. 2 except the matters described above will not be described because they have the same or similar configuration with those in FIG. 2.

Figure 4:
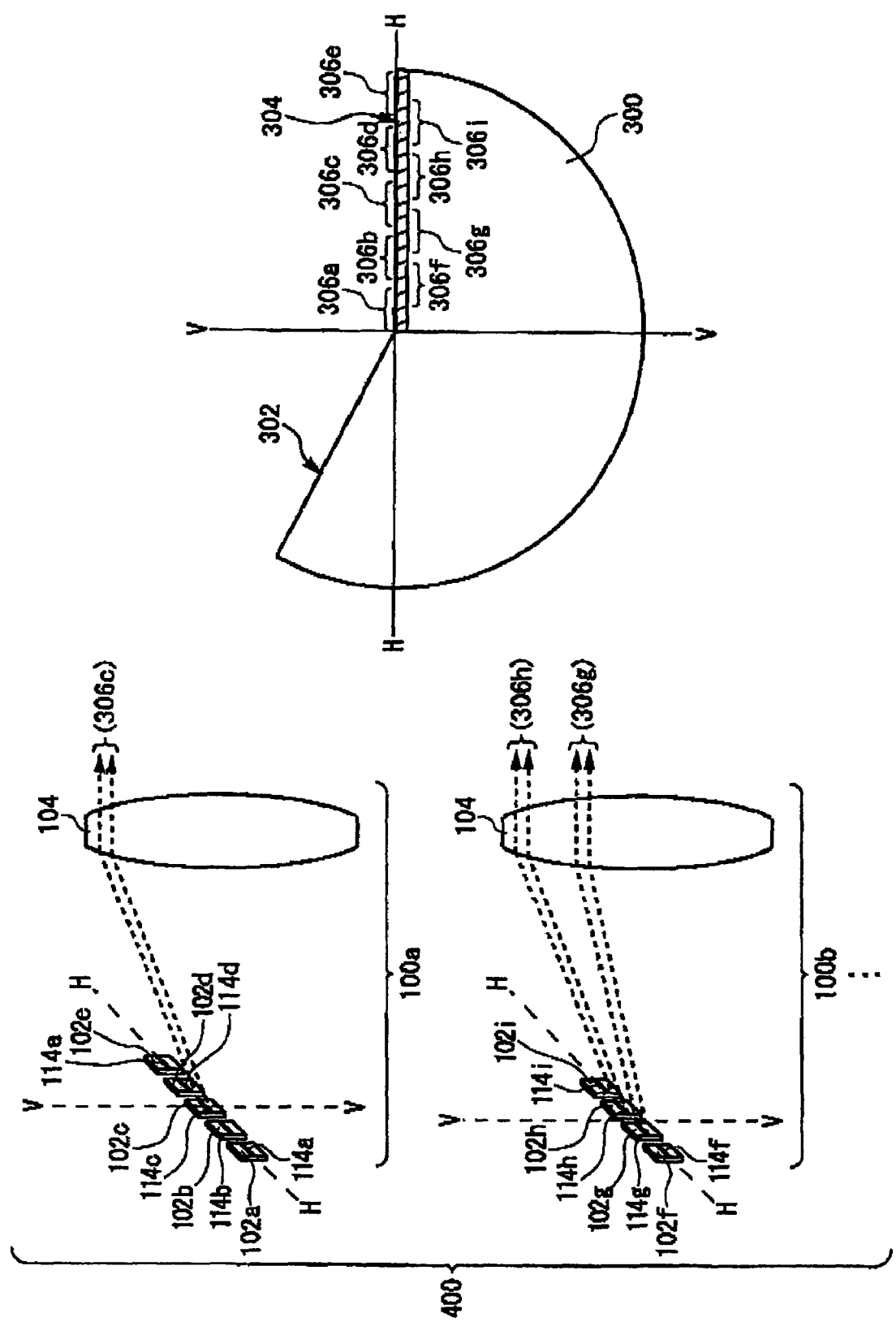
FIG. 4 shows an example of a light distribution pattern.

FIG. 4 shows an example of a light distribution pattern 300 formed by the vehicular lamp 400. The light distribution pattern 300 is a low beam light distribution pattern being formed on a vertically virtual screen disposed at 25 meters away from the front of the light source unit 100. In this embodiment, the vehicular lamp 400 forms the light distribution pattern 300 which has a horizontal cut line 304 for determining the boundary between bright and dark approximately horizontally, and a slanting cut line 302 for determining the boundary between bright and dark slanting by about 15 degrees to the horizontal direction.

The vehicular lamp 400 in this embodiment includes a plurality of light source units 100 whose light distribution characteristics are different from each other to form the light distribution pattern 300 based on the light generated by each of the light source units 100. In this case, each of the light source units 100 forms a partial area of the light distribution pattern 300. For example, the light source unit 100*a* forms partial areas 306*a* to 306 *e* of the light distribution pattern 300. The light source unit 100*b* forms partial areas 306*f* to 306*i*.

Hereinafter, the light distribution characteristics of the light source units 100*a* and 100*b* will be described in further detail. With respect to the light source unit 100*a* the plurality of semiconductor light emitting elements 102*a* to 102*e* are horizontally arranged in a row towards the lateral direction to the vehicle corresponding to the horizontal cut line 304. Accordingly, the plurality of light emitting areas 114*a* to 114*e* is arranged in an approximately straight line.

The lens 104 projects each of the shapes of the light emitting areas 114*a* to 114*e* with regard to the semiconductor light emitting elements 102*a* to 102*e* towards the areas 306*a* to. 306*e* arranged along the positions at which the horizontal cut line 304 should be formed. The lens 104 may project the shapes of the light emitting areas 114*a* to 114*e* to different areas respectively.

Here, the lens 104 has its optical center F on the light emitting area 114*c*. The plurality of light emitting areas 114*a* to 114*e* are provided within a surface including the optical center F perpendicular to the optical axis of the light source unit 100*a*. Accordingly, the lens 104 clearly projects the shapes of the light emitting areas 114*a* to 114*e* to the areas 306*a* to 306*e* on the vertically virtual screen. The lens 104 may deflect the emitted light from the center of the light distribution pattern 300 in the lateral direction to the vehicle by way of a lens step. In this case, the light can be properly emitted to the areas 306*a* to 306*e* along the position at which the horizontal cut line 304 should be formed.

Meanwhile, with regard to the light source unit 100*b*, the semiconductor light emitting elements 102*f* to 102*i* are horizontally arranged in a row towards the same direction as that of the semiconductor light emitting elements 102*a* to 102*e*. The lens 104 projects each of the shapes of the light emitting areas 114*f* to 114*i* with regard to the semiconductor light emitting elements 102*f* to 102*i* towards the areas 306*f* to 306*i* arranged along the positions at which the horizontal cut line 304 should be formed. In this case, the lens 104 projects the shapes of the light emitting areas 114*f* to 114*i* in order that the center of each of the areas 306*f* to 306*i* matches each of the boundaries or the gaps between any adjacent two of the areas 306*a* to 306*e* formed by the light source unit 100*a*.

Accordingly, the light source units 100*a* and 100*b* form the plurality of areas 306*a* to 306*i* in a row with no gaps. In addition, the light source units 100*a* and 100*b* properly form the horizontal cut line 304. Further, the rest light source units 100 except the light source units 100*a* and 100*b* emit light towards areas except the areas 306*a* to 306*i* of the light distribution pattern 300.

Here, if the gaps among the semiconductor light emitting elements 102*a* to 102*e* are large, there might be dark regions in the light distribution pattern formed by the vehicular lamp 400 in response to the gaps, simply with the light generated by the light source unit 100a being emitted forward. However, according to this embodiment, although the light source unit 100a forms the light distribution pattern having the dark regions, the light distribution pattern can be properly formed by compensating for the light generated by the light source unit 100b. According to this embodiment, the cut line of the light distribution pattern 300 can be formed clearly and properly. In addition, the light distribution pattern can be formed properly.

Figure 5:
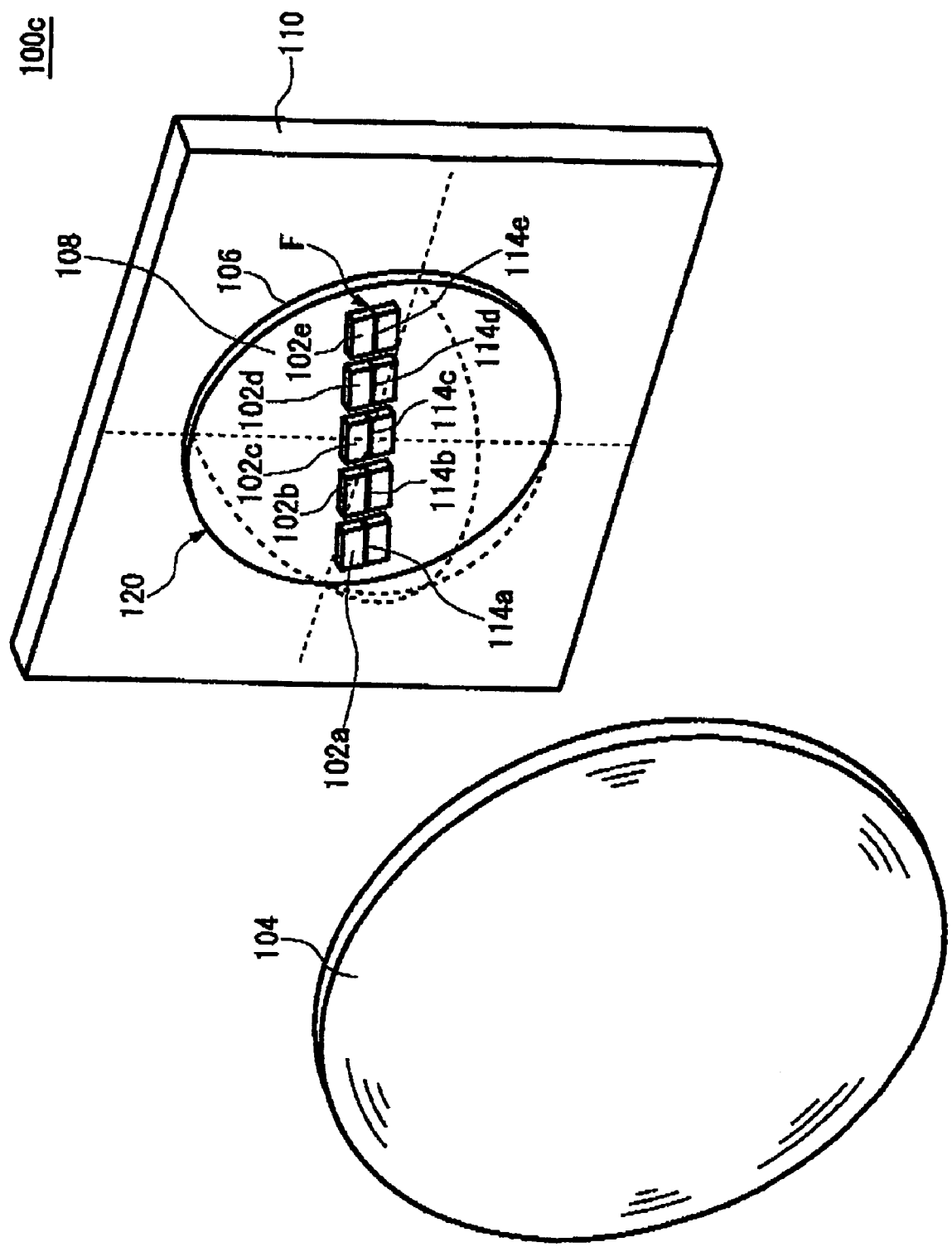
FIG. 5 shows an example of the configuration of a light source unit.

FIG. 5 shows an example of the configuration of a light source unit 100c. The light source unit 100c includes a supporting member 110, a light source 120, and a lens 104. The light source 120 includes a substrate 106, a plurality of semiconductor light emitting elements 102a to 102d, and a sealing member 108.

With regard to the light source unit 100c, the plurality of semiconductor light emitting elements 102a to 102e are arranged in a row slanting by 15 degrees to the horizontal direction corresponding to the slanting cut line 302 (cf. FIG. 4). The semiconductor light emitting elements 102a to 102e are arranged in order that their light emitting areas 114a to 114e are arranged in an approximately straight line in the slanting direction.

The lens 104 projects the images of the light emitting areas 114a to 114e, and forms at least a part of the slanting cut line 302 based on the boundary between bright and dark of those images. According to this embodiment, the slanting cut line 302 can be properly formed. Further, matters in FIG. 5 given the same symbols as those in FIG. 2 except the matters described above will not be described because they have the same or similar configuration with those in FIG. 2.

Figure 6:
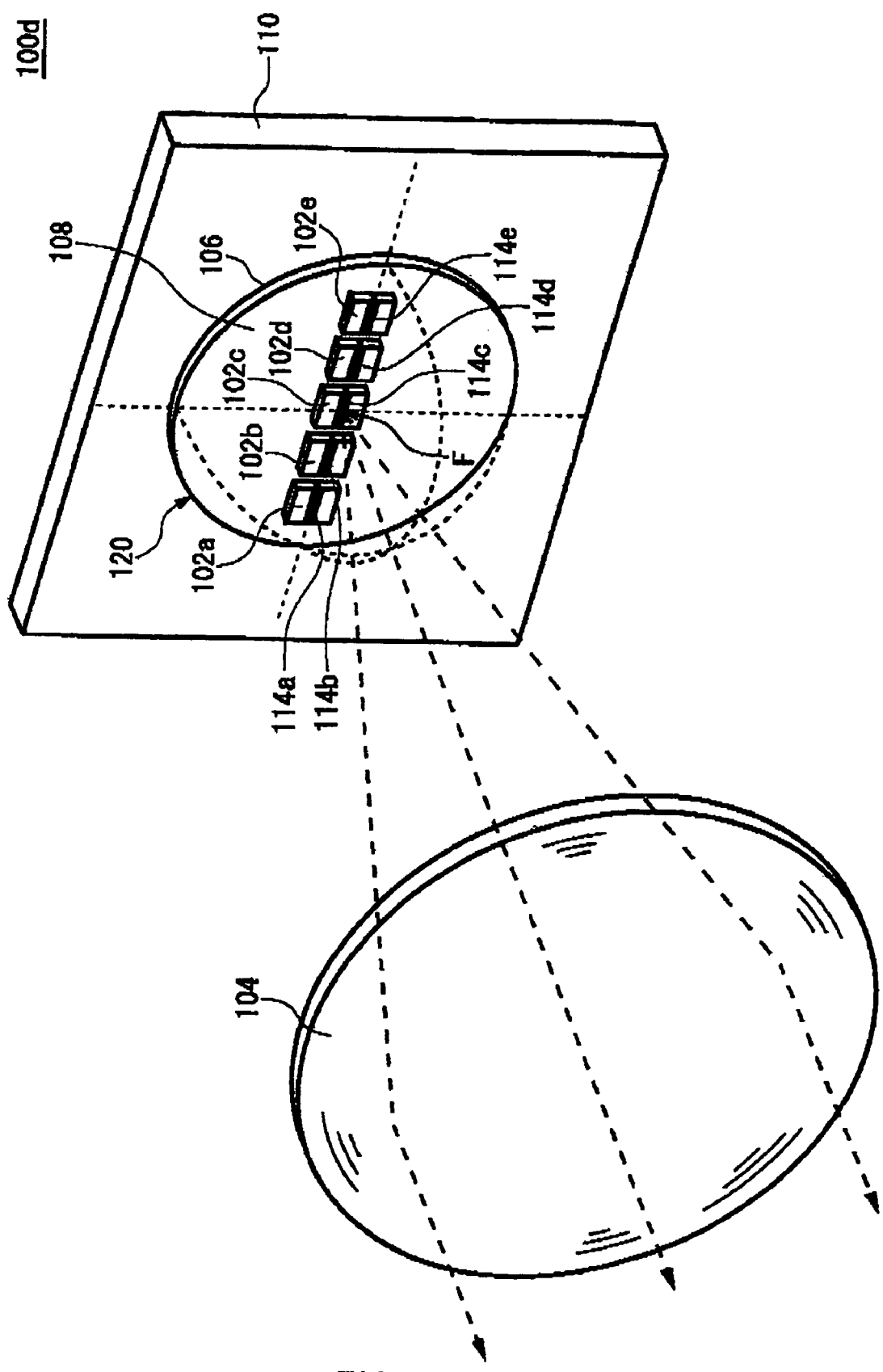
FIG. 6 shows an example of the configuration of a light source unit 100d.

FIG. 6 shows an example of the configuration of a light source unit 100d. The light source unit 100d includes a supporting member 110, a light source 120, and a lens 104. The light source 120 includes a substrate 106, a plurality of semiconductor light emitting elements 102a to 102e, and a sealing member 108.

With regard to the light source unit 100d, the semiconductor light emitting elements 102a to 102e has light emitting areas 114a to 114e whose width is broader than that of the light emitting areas 114a to 114e of the light source unit 100a (cf. FIG. 2). The semiconductor light emitting elements 102a to 102e may have their light emitting areas 114a to 114e whose width is about 0.3 to 0.4 mm.

In this case, the lens 104 projects the images of the light emitting areas 114a to 114e whose width is larger than that of the images of the light emitting areas 114a to 114e formed by the light source unit 100a. The lens 104 projects theses images towards a part of the light distribution pattern 300 (cf. FIG. 4) except the cut line. The lens 104 may emit the light generated by the semiconductor light emitting elements 102a to 102e as diffuse light towards a part except the cut line. In this embodiment, the light distribution pattern 300 can be properly formed. Further, matters in FIG. 6 given the same symbols as those in FIG. 2 except the matters described above will not be described because they have the same or similar configuration with those in FIG. 2.

Figure 7:
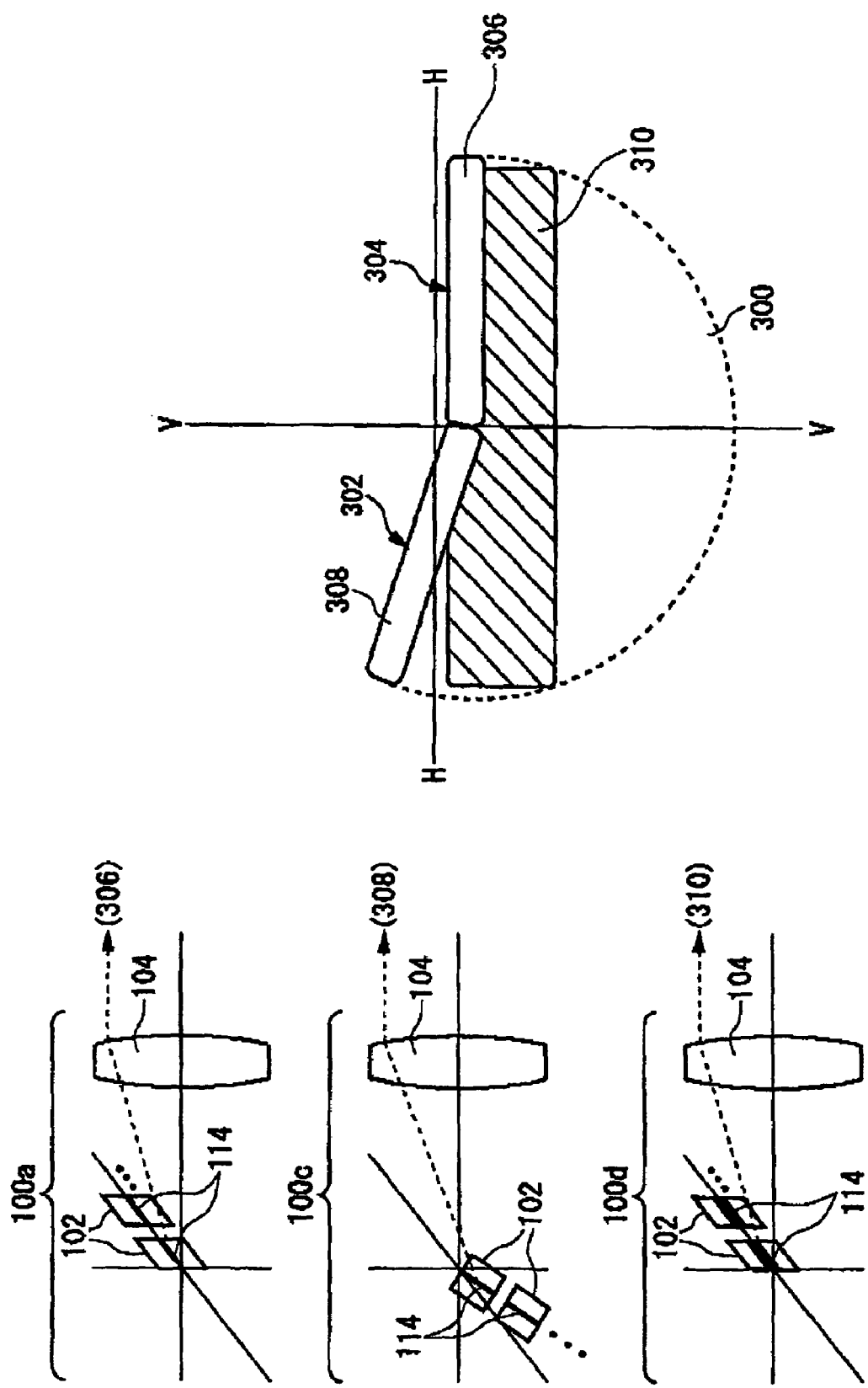
FIG. 7 shows an example of the light distribution characteristics of a plurality of the light source units.

FIG. 7 shows an example of the light distribution characteristics of the plurality of the light source units 100a, 100c, and 100d. In this embodiment, the light source units 100a, 100c, and 100d emit light towards the partial areas 306, 308, and 310 respectively with regard to the light distribution pattern 300 of the vehicular lamp 400 (cf. FIG. 1).

For example, the light source unit 100a emits light towards the area 306 having its boundary which is at least a part of the horizontal cut line 304 by projecting the shapes of the light emitting areas 114 forward, where each of the light emitting areas 114 is positioned on the semiconductor light emitting elements 102 arranged in a row in the horizontal direction respectively. Accordingly, the light source unit 100a forms at least a part of the horizontal cut line 304.

In addition, the light source unit 100c emits light towards the area 308 having its boundary which is at least a part of the horizontal cut line 302 by projecting the shapes of the light emitting areas 114 forward, where each of the light emitting areas 114 is positioned on the semiconductor light emitting elements 102 arranged in a row in the slanting direction respectively. Accordingly, the light source unit 100c forms at least a part of the horizontal cut line 302.

The light source unit 100d emits light towards the area 310 below the horizontal cut line 304 by projecting the shapes of the light emitting areas 114 forward, where each of the light emitting areas 114 is positioned on the semiconductor light emitting elements 102 arranged in a row in the horizontal direction respectively. The light source unit 100d emits light towards the area 310 which is larger than the area 306 by projecting the shapes of the light emitting areas 114 forward, where the width of the light emitting areas 114 is broader than that of the light emitting areas 114 of the light source unit 100a. Accordingly, the light source unit 100c emits diffuse light towards at least a part of the horizontal cut line 302 to form a part except the cut line.

According to this embodiment, the slanting and horizontal cut lines 302 and 304 can be formed properly and clearly. In addition, the proper light distribution pattern 300 can be formed. Further, with regard to the light source units 100a and 100c, the lens 104 may deflect the emitted light from the center of the light distribution pattern 300 by way of a lens step. In this case, each of the light source units 100a and 100c may deflect light in the opposite directions. In addition, the light source unit 100d may emit light towards the area 310 without deflecting light by a lens step.

The vehicular lamp 400 (cf. FIG. 1) may further include a plurality of light source units 100 for emitting the light which is complementary to that of the light source units 100c and 100d. These light source units 100 may, like the light source unit 100b to the light source unit 100a (cf. FIG. 3), emit light towards the gaps of the light emitted by the light source units 100c and 100d in a complementary manner.

Figure 8:
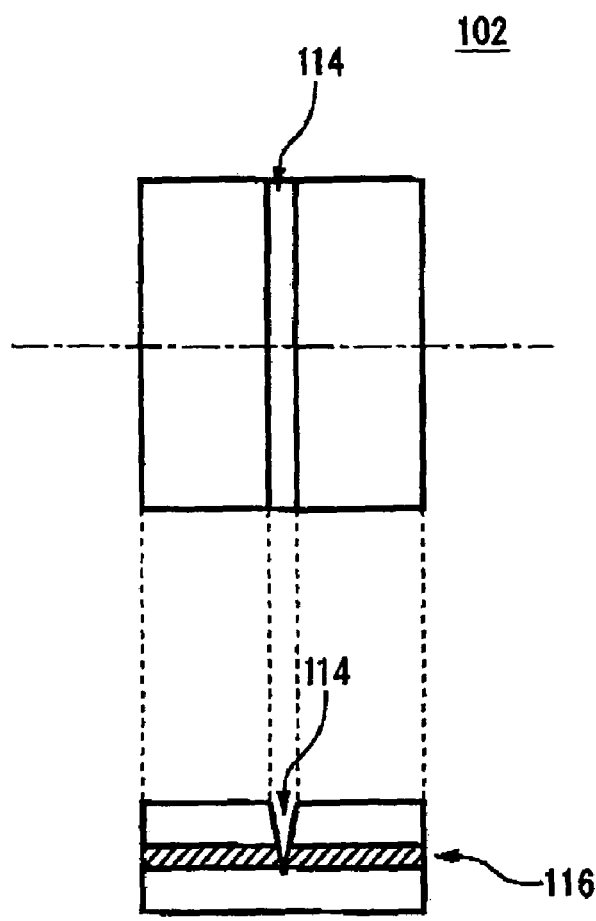
FIG. 8 shows an example of the configuration of a semiconductor light emitting element.

FIG. 8 shows an example of the configuration of the semiconductor light emitting element 102. The semiconductor light emitting element 102 includes an active layer 116 and a light emitting area 114. The active layer 116 is a layer having a PN junction formed inside the semiconductor light emitting element 102, and generates the light of a waveform determined by the PN junction characteristics such as ultraviolet light or blue light in response to the power supplied to the semiconductor light emitting element 102.

In this embodiment, the light emitting area 114 is a V-shaped groove formed on the surface of the semiconductor light emitting element 102 extending in an approximately straight line. This groove reaches at least a part of the active layer in depth. Accordingly, the light emitting area 114 generates light from at least apart of an opening of the groove. Therefore, the light emitting area 114 generates light from an approximately linear area.

In addition, the light emitting area 114 extends in the lateral direction to the vehicle when it is attached to the vehicle body, corresponding to the horizontal cut line 304 (cf. FIG. 4). In this case, the lens 104 (cf. FIG. 4) can properly form at least a part of the horizontal cut line 304 by projecting the shape of the light emitting area 114.

Further, the semiconductor light emitting element 102 is an edge emitting type light emitting diode for generating light in the direction perpendicular to its surface. In this case, the active layer 116 generates light in the direction perpendicular to the surface of the semiconductor light emitting element 102 towards a section of the groove-shaped light emitting area 114 reaching the active layer 116. The light emitting area 114 reflects light on a wall surface of the groove so as to emit light in the direction perpendicular to the surface of the semiconductor light emitting element 102. In this case, the semiconductor light emitting element 102 emits light with high brightness by generating the light at the groove-shaped light emitting area 114 intensely. According to this embodiment, it is possible to provide a light source for generating light with high brightness from a narrow and linear area.

And, the semiconductor light emitting element 102 may have a fluorescent material covering at least a part of the opening of the groove. This fluorescent material may generate white light or yellow light in response to the light emitted from the light emitting area 114. According to this embodiment, a semiconductor light emitting element having an approximately linear light emitting area can be formed properly.

In another embodiment, the semiconductor light emitting element may be a surface emitting type light emitting diode for emitting light in the direction perpendicular to its surface. In this case, the light emitting area 114 may be a groove whose depth does not reach the active layer 116 formed to give out light from the surface of the semiconductor light emitting element 102. Also in this case, the light emitting area 114 may be formed to cover a part of the surface of the semiconductor light emitting element 102 except the light emitting area 114 with a translucent member.

Figure 9:
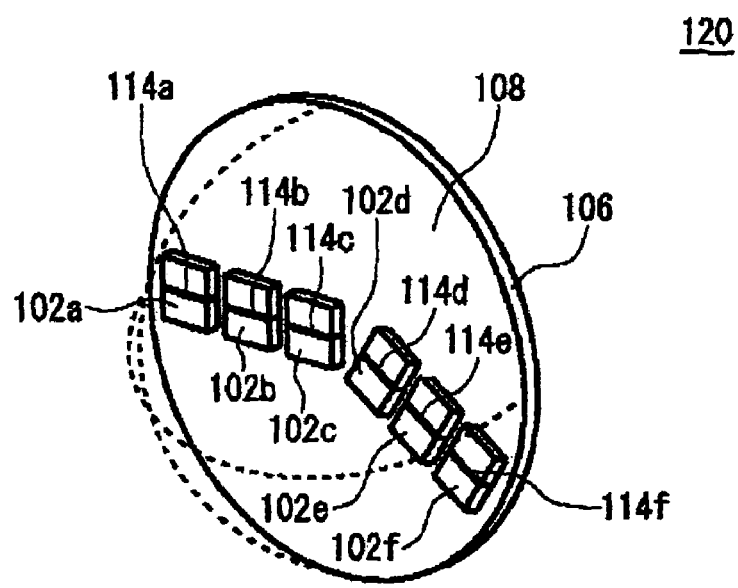
FIG. 9 shows another example of the configuration of a light source.

FIG. 9 shows another example of the configuration of the light source 120. In this embodiment, the light source includes a plurality of semiconductor light emitting elements 102a to 102f. The semiconductor light emitting elements 102a to 102c are arranged in a row in an approximately lateral direction to the vehicle responding to the horizontal cut line 304 (cf. FIG. 4). In addition, the semiconductor light emitting elements 102d to 102f are arranged obliquely downwards in a row in an approximately lateral direction to the vehicle corresponding to the slanting cut line 302 (cf. FIG. 4). In addition, the semiconductor light emitting elements 102a to 102f are arranged in the inverted V-shaped.

In this case, the lens 104 (cf. FIG. 2) forms the horizontal cut line 304 based on the light emitted from the light emitting area 114a to 114c of the semiconductor light emitting element 102a to 102c, and the slanting cut line 302 based on the light emitted from the light emitting area 114d to 114f of the semiconductor light emitting element 102d to 102f. Also in this case, the cut line can be formed clearly and properly. In addition, the light distribution pattern can be properly. Further, matters in FIG. 9 given the same symbols as those in FIG. 2 except the matters described above will not be described because they have the same or similar configuration with those in FIG. 2.

Figure 10:
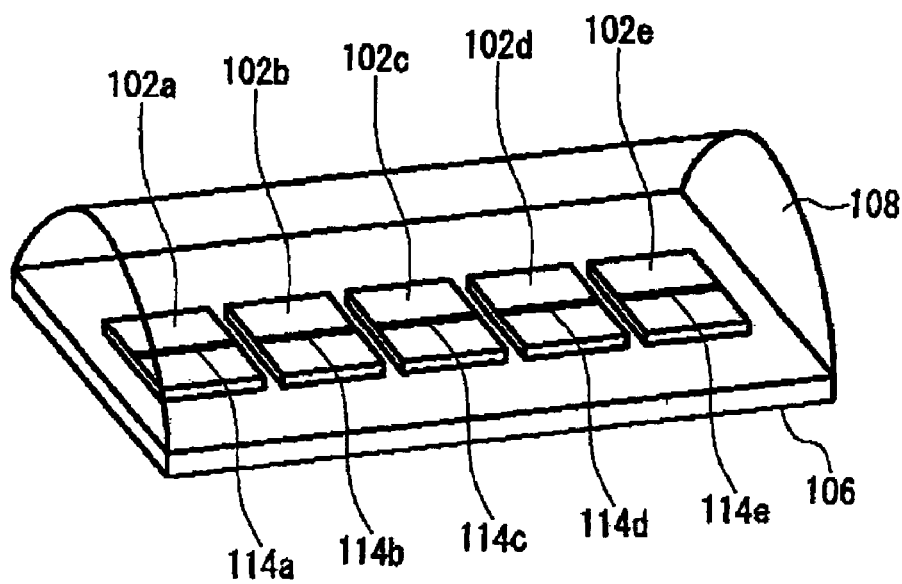
FIG. 10 shows further another example of the configuration of the light source.

FIG. 10 shows further another example of the configuration of the light source 120. In this embodiment, a plurality of semiconductor light emitting elements 102a to 102e are arranged in a row. And, the sealing member 108 has an approximately half cylindrical shape into which an approximate cylinder is divided by a surface including the center axis. The sealing member 108 may function as a cylindrical lens.

The sealing member 108 has its center axis approximately on the light emitting areas 114a to 114e, and its longitudinal direction is oriented to the direction in which the semiconductor light emitting elements 102a to 102e are arranged. In this case, the light source 120 emits the light generated from the approximately linear areas outwards with high symmetry. In addition, the size of the light source 120 can be reduced. Further, matters in FIG. 10 given the same symbols as those in FIG. 2 except the matters described above will not be described because they have the same or similar configuration with those in FIG. 2.

Figure 11:
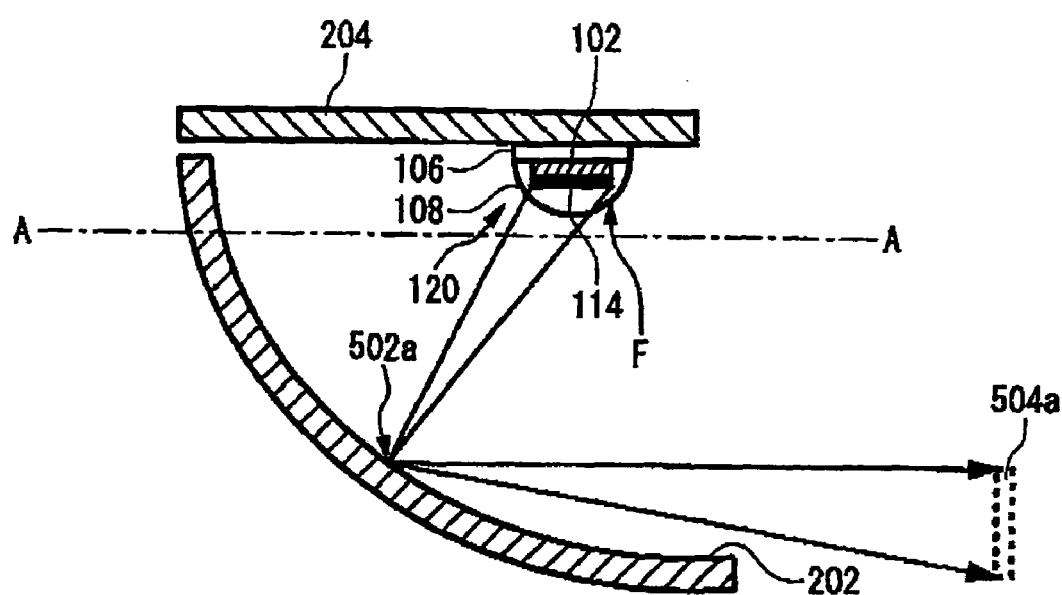
FIG. 11 shows a vertically cross-sectional view BB of a light source unit.
Figure 12:
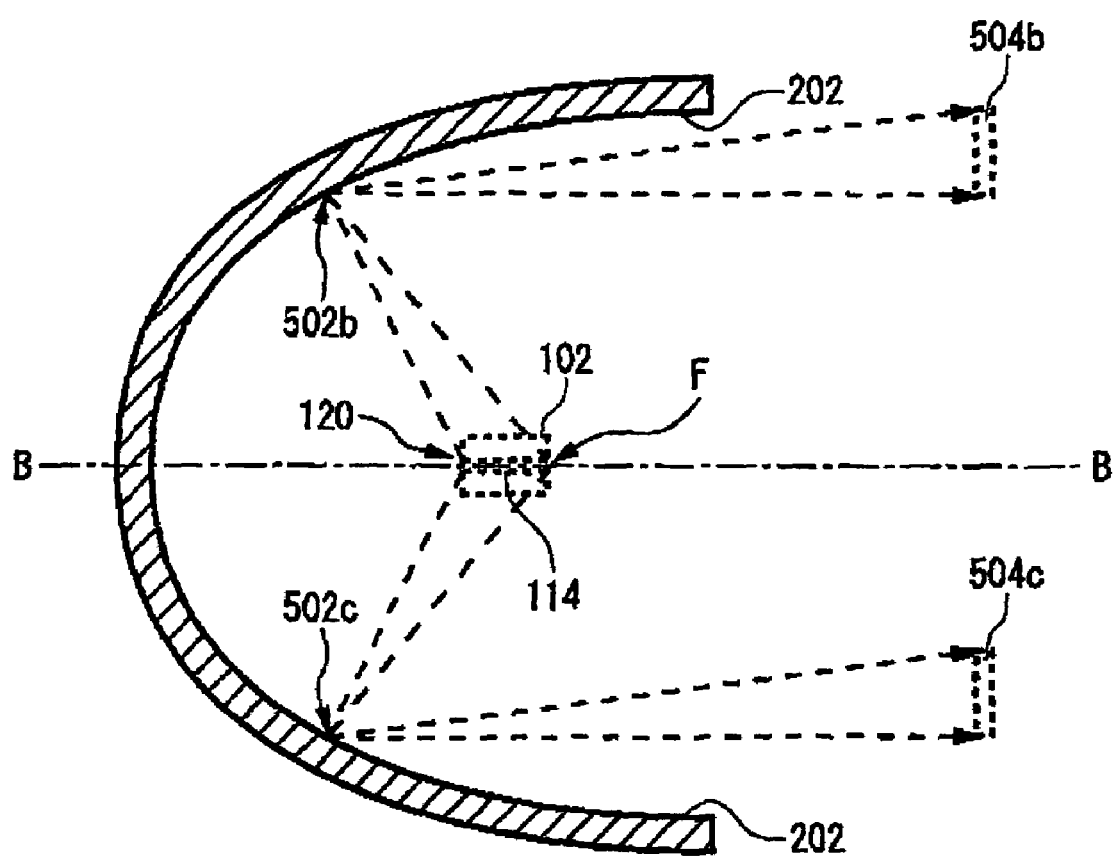
FIG. 12 shows a horizontally cross-sectional view AA of a light source unit.

FIGS. 11 and 12 show further another example of the configuration of the light source unit 100. FIG. 11 shows a vertically cross-sectional view BB of the light source unit 100. FIG. 12 shows a horizontally cross-sectional view AA of the light source unit 100. In this embodiment, the light source unit 100 includes a supporting member 204, a light source 120, and a reflector 202. The supporting member 204 is a plate-shaped body for supporting the light source 120 on an approximately horizontal lower surface. The supporting member 204 may function as a heat radiating plate for radiating the heat from the light source 120. The light source 120 includes a substrate 106, a sealing member 108, and a plurality of semiconductor light emitting element 102, and is attached downwards on the lower surface of the supporting member 204.

The semiconductor light emitting element 102 has the same or similar function as that of the semiconductor light emitting element 102 described in connection with FIG. 8, and is fixed in order that the longitudinal direction of light emitting area 114 is approximately parallel to the forward or backward direction. The substrate 106 and the sealing member 108 may have the same or similar functions as those of the substrate 106 and the sealing member 108 described in connection with FIG. 2.

The reflector 202, which is an example of an optical device for reflecting the light generated by the semiconductor light emitting element 102, extends forward and downwards from the back of the light source 120 to cover the light source 120, and faces the supporting member 204 with the light source interposed therebetween. In this embodiment, the reflector 202 which is a parabola reflector has its optical center F near the front end of the light emitting area 114.

The reflector 202, as shown in FIGS. 9 and 10, reflects the light generated from the light emitting areas 114 of the semiconductor light emitting elements 102 forward at each point on the reflector 202 such as points 502a to 502c. And the reflector 202 forms the images 504a to 504c of the light emitting areas 114, each of which corresponds to the points 502a to 502c, in front of the vehicle. The light source unit 100 forms a part of the light distribution pattern of the vehicular lamp 400 (cf. FIG. 1) by projecting the images 504a to 504c forward. According to this embodiment, the light distribution pattern can also be formed properly.

Figure 13:
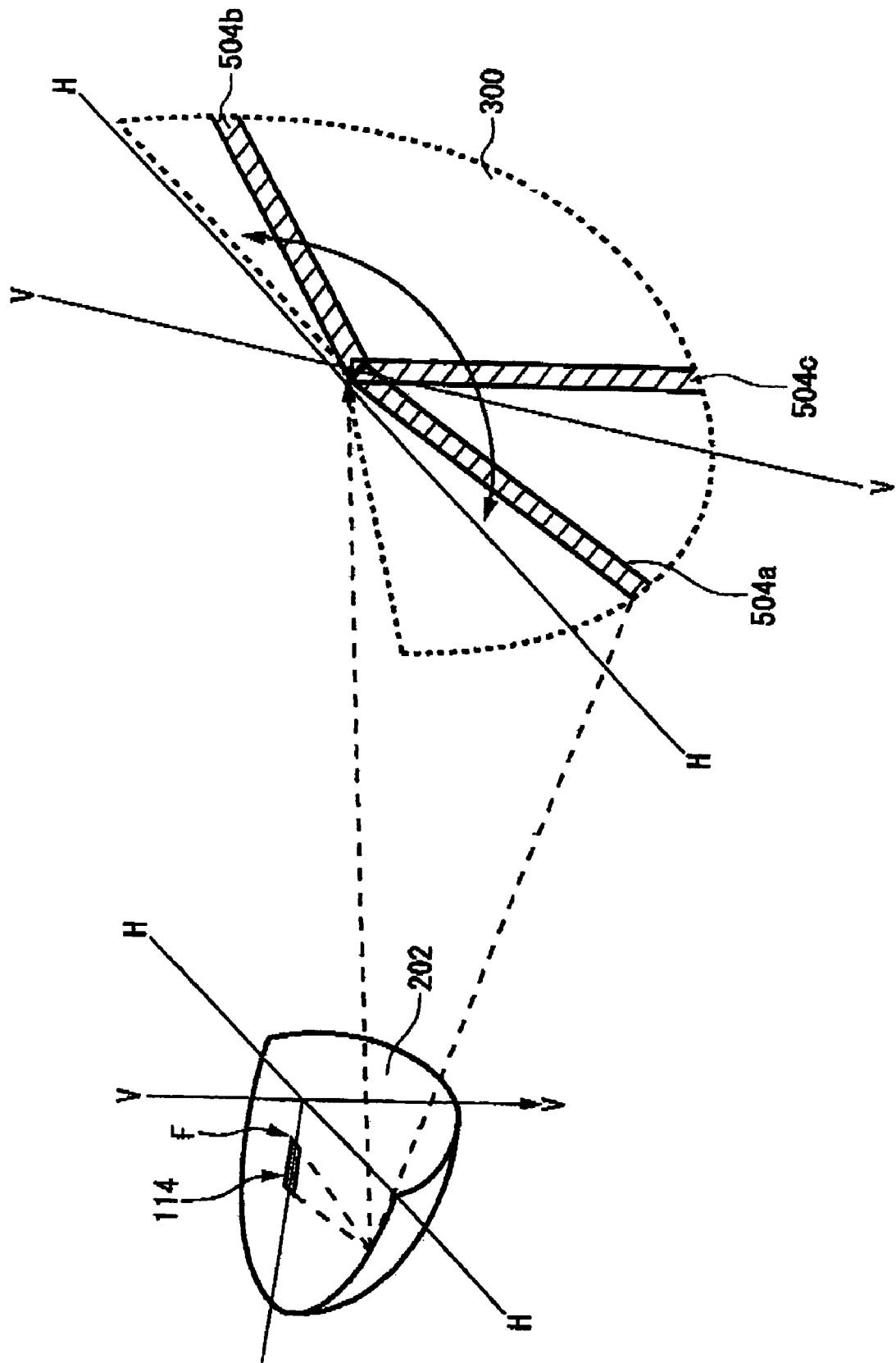
FIG. 13 shows an example of a light distribution pattern.

FIG. 13 shows an example of the light distribution pattern formed by the light source unit 100 described in connection with FIGS. 11 and 12. In this embodiment, the light emitting areas 114 of the semiconductor light emitting elements 102 (cf. FIG. 11) are provided more backwards than the optical center F to the vehicle. In this case, the reflector 202 forms the images 504 of the light emitting areas 114 without crossing the reflected light against the optical axis.

Accordingly, the reflector 202 projects the image of one end of the light emitting areas 114 close to the optical center F towards the vicinity of the center of the light distribution pattern 300, whereas projecting the image of the other end of the light emitting areas 114 far away from the optical center F towards the edge of the light distribution pattern 300 far away from the center thereof. Accordingly, the light source unit 100 forms the images 504 which range from the center to edge of the light distribution pattern 300 corresponding to each of the points on the reflector 202. For example, the light source unit 100 forms the images 504a to 504c corresponding to the points 502a to 502c (cf. FIGS. 11 and 12).

The light source unit 100 forms a plurality of images 504 corresponding to a plurality of points on the reflector 202 so as to form at least a part of the light distribution pattern 300. According to this embodiment, the light distribution pattern can be properly formed.

Figure 14:
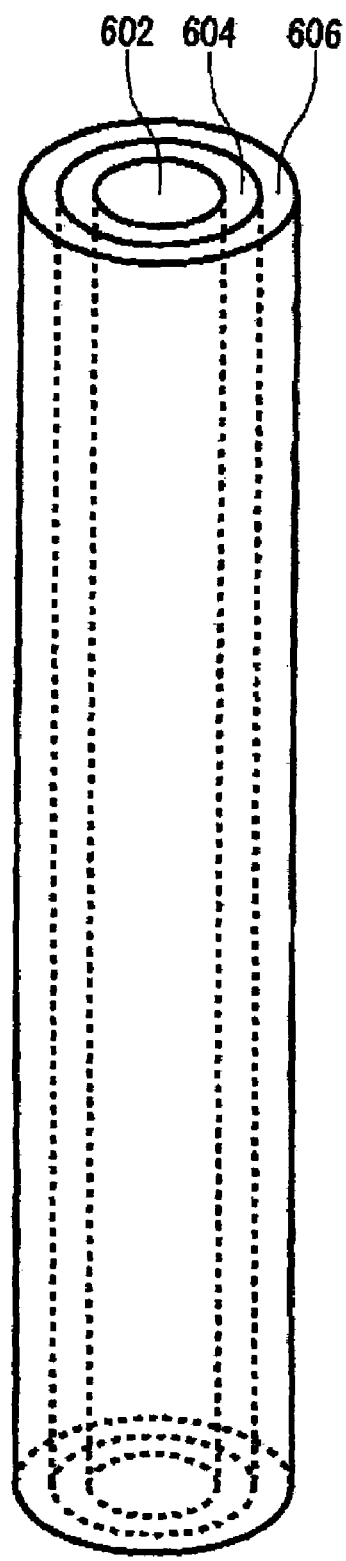
FIG. 14 shows another example of the configuration of a semiconductor light emitting element.

FIG. 14 shows another example of the configuration of the semiconductor light emitting element 102. In this embodiment, the semiconductor light emitting element 102 which has an approximately cylindrical shape includes a sapphire section 602, an N-type semiconductor layer 604, and a P-type semiconductor layer 606. The sapphire section 602 is a rod formed of sapphire, and is used for growing GaN crystal on the side surface thereof.

The N-type semiconductor layer 604 approximately covers the side surface of the sapphire section 602. The N-type semiconductor layer 604 is formed by sequentially laminating a polycrystalline GaN buffer layer, a single crystal N-type GaN layer, and an N-type AlGaN layer on the side surface of the sapphire section 602.

The P-type semiconductor layer 606 approximately covers the surface of the N-type semiconductor layer 604. The P-type semiconductor layer 606 is formed by sequentially laminating a P-type InGaN active layer doped with Zn, a P-type AlGaN layer, and a P-type GaN layer on the N-type AlGaN layer of the N-type semiconductor layer 604.

Accordingly, the semiconductor light emitting element 102 generates blue light by way of the P-type InGaN active layer. And the semiconductor light emitting element 102 passes and emits the generated blue light outwards through each of the layers laminated over the P-type InGaN active layer. Accordingly, the semiconductor light emitting element 102 generates light from a linear light emitting area. According to this embodiment, the semiconductor light emitting element 102 can be properly formed.

Further, the rod-shaped sapphire section 602 may be formed by a mechanical process. And the sapphire section 602 may be an approximately linear plate. Each of the layers of the N-type and p-type semiconductor layers 604 and 606 may be laminated by MOCVD (Metallo Organic Chemical Vapor Deposition), MBE (Molecular Beam Epitaxy), LPE (Liquid Phase Epitaxy), etc.

In addition, each of the N-type and p-type semiconductor layers 604 and 606 receives power from an electrode which is not shown. The electrode for the N-type semiconductor layer 604 may be formed by exposing a part of the N-type semiconductor layer 604 by eliminating a part of the P-type semiconductor layer 606 through etching.

In another embodiment, a part of a layer included in the N-type or P-type semiconductor layer 604 or 606 may be formed into a rod by a CZ (Czochralski) method or FZ (Floating Zone) method, and the semiconductor light emitting element 102 may be formed by laminating the other layers on the rod. In this case, the size of the semiconductor light emitting element 102 can be reduced by not using the sapphire section 602. Further, the N-type and p-type semiconductor layers 604 and 606 may be formed of N-type SiC and F-type SiC respectively.

The headlamp to which the present invention may be applied includes, but not limited to, a regular headlamp, fog lamp and cornering lamp of automobiles, motorcycles and trains.

As obvious from the description above, according to the present invention, it is possible to properly form the light distribution pattern.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular headlamp for emitting light with a predetermined light distribution pattern, comprising:
    a semiconductor light emitting element comprising a substantially linear light emitting area for generating said light therefrom; and
    an optical device for forming at least a part of a cut line to determine a boundary between bright and dark with regard to said light distribution pattern by reflecting or deflecting said light generated by said semiconductor light emitting element and projecting a shape of said light emitting area,
    wherein the substantially linear light emitting area comprises a rectangular surface of the semiconductor light emitting element; and an edge of the rectangular surface defines a portion of the cut line.

2. A vehicular headlamp as claimed in claim 1, further comprising:
    a plurality of said semiconductor light emitting elements being arranged in a row in a direction corresponding to at least a part of said cut line,
    wherein said optical device forms at least a part of said cut line by projecting said shape of said light emitting area with regard to each of said plurality of semiconductor light emitting elements towards positions arranged in a row over at least a part of said cut line.

3. A vehicular headlamp as claimed in claim 1, wherein:
    said semiconductor light emitting element further comprises an active layer; and
    said light emitting area has a groove for emitting said light from at least a part of an opening of said groove, said groove substantially linearly extending on a surface of said semi-conductor light emitting element, the depth of said groove reaching at least a part of said active layer.

4. A vehicular headlamp as claimed in claim 3, wherein the substantially linearly extending groove comprises a thin rectangular shape on upper surface of the semiconductor light emitting element; and an edge of the groove defines a portion of the cut line.

5. A vehicular headlamp as claimed in claim 1, the vehicular headlamp further comprising:
    a first row of the semiconductor light emitting elements with rectangular surfaces, wherein edges of the rectangular surfaces of the first row of the semiconductor light emitting elements define a portion of a first cut line; and
    a second row, arranged at an angle to said first row, of the semiconductor light emitting elements with rectangular surfaces, wherein edges of the rectangular surfaces of the second row of the semiconductor light emitting elements define a portion of a second cut line.

6. A vehicular headlamp as claimed in claim 1, further comprising:

a first row of the semiconductor light emitting elements; and a second row, arranged at a first angle to said first row, of the light emitting elements, wherein said optical device forms a length of a first cut line by projecting the shapes of the light emitting areas of the first row of the semiconductor light emitting elements, and wherein said optical device forms a length of a second cut line, arranged at a second angle to the first cut line, by projecting the shapes of the light emitting areas of the second row of the semiconductor light emitting elements.

7. A vehicular headlamp as claimed in claim 1, wherein the optical device comprises a lens.

8. A vehicular headlamp as claimed in claim 1, wherein the optical device comprises a reflector.

9. A semiconductor light emitting element used for a vehicular headlamp for emitting light with a predetermined light distribution pattern, comprising:

an active layer, and a light emitting area having a groove for emitting said light from at least a part of an opening of said groove, said groove extending on a surface of said semiconductor light emitting element in a direction corresponding to at least a part of a cut line to determine a boundary between bright and dark with regard to said light distribution pattern, the depth of said groove reaching at least a part of said active layer, wherein the light emitting area comprises a rectangular surface of the semiconductor light emitting element; and an edge of the rectangular surface defines a portion of the cut line.

10. A semiconductor light emitting element used for a vehicular headlamp as claimed in claim 9, wherein the groove comprises a thin rectangular shape on the surface of the semiconductor light emitting element; and an edge of the groove defines a portion of the cut line.

11. A semiconductor light emitting element used for a vehicular headlamp as claimed in claim 9, wherein the groove comprises a thin rectangular shape on the surface of the semiconductor light emitting element; the vehicular headlamp further comprising:

a first row of the semiconductor light emitting elements with thin rectangular grooves, wherein edges of the thin rectangular grooves of the first row of the semiconductor light emitting elements define a length of a first cut line; and a second row, arranged at an angle to said first row, of the semiconductor light emitting elements with thin rectangular grooves, wherein edges of the thin rectangular grooves of the second row of the semiconductor light emitting elements define a length of a second cut line.

12. A semiconductor light emitting element used for a vehicular headlamp as claimed in claim 9, wherein the vehicular headlamp comprises a lens for projecting the light emitted from the groove extending on a surface of said semiconductor light emitting element.

13. A semiconductor light emitting element used for a vehicular headlamp as claimed in claim 9, wherein the vehicular headlamp comprises a reflector for projecting the light emitted from the groove extending on a surface of said semiconductor light emitting element.

14. A vehicular headlamp, comprising:

a semiconductor light emitting element comprising an elongated light emitting area for emitting light in an elongated pattern;

an optical device for reflecting or deflecting the elongated pattern of emitted light, and for projecting the elongated pattern of emitted light to define a portion of a headlamp cut line, the portion of the headlamp cut line being formed by an edge of the elongated pattern of emitted light, wherein the elongated light emitting area comprises a rectangular surface of the semiconductor light emitting element; and an edge of the rectangular surface defines a portion of the cut line.

15. A vehicular headlamp as claimed in claim 14, wherein the elongated light emitting area comprises a rectangular surface of the semiconductor light emitting element, the vehicular headlamp further comprising:

a first row of the semiconductor light emitting elements with rectangular surfaces, wherein edges of the rectangular surfaces of the first row of the semiconductor light emitting elements define a portion of a first cut line; and a second row, arranged at an angle to said first row, of the semiconductor light emitting elements with rectangular surfaces, wherein edges of the rectangular surfaces of the second row of the semiconductor light emitting elements define a portion of a second cut line.

16. A vehicular headlamp for emitting light with a predetermined light distribution pattern, comprising:

a plurality of semiconductor light emitting elements, each comprising a substantially linear light emitting area for generating said light therefrom, and arranged so that their light emitting areas are arranged in an approximately straight line; and an optical device for forming at least a part of a cut line to determine a boundary between bright and dark with regard to said light distribution pattern by reflecting or deflecting said light generated by said semiconductor light emitting element and projecting a shape of said light emitting area, wherein the light emitting area emits a light through at least a part of an opening formed on a surface of said semiconductor light emitting element, said opening extending substantially linearly along said semiconductor light emitting element, and wherein the substantially linear light emitting area comprises a rectangular surface of the semiconductor light emitting element; and an edge of the rectangular surface defines a portion of the cut line.

17. A vehicular headlamp as claimed in claim 16, further comprising:

a plurality of said semiconductor light emitting elements being arranged in a row in a direction corresponding to at least a part of said cut line, wherein said optical device forms at least a part of said cut line by projecting said shape of said light emitting area with regard to each of said plurality of semiconductor light emitting elements towards positions arranged in a row over at least a part of said cut line.

18. A vehicular headlamp as claimed in claim 16, wherein:

said semiconductor light emitting element further comprises an active layer; and said light emitting area has a groove for emitting said light from at least a part of an opening of said groove, said groove substantially linearly extending on a surface of said semi-conductor light emitting element, the depth of said groove reaching at least a part of said active layer.

19. A vehicular headlamp as claimed in claim 16, wherein the substantially linear light emitting area comprises a rectangular surface of the semiconductor light emitting element, the vehicular headlamp further comprising:

a first row of the semiconductor light emitting elements with rectangular surfaces, wherein edges of the rectangular surfaces of the first row of the semiconductor light emitting elements define a portion of a first cut line; and a second row, arranged at an angle to said first row, of the semiconductor light emitting elements with rectangular surfaces, wherein edges of the rectangular surfaces of the second row of the semiconductor light emitting elements define a portion of a second cut line.

* * * * *